United States Patent
Byun et al.

(10) Patent No.: US 8,652,858 B2
(45) Date of Patent: Feb. 18, 2014

(54) CHIP TESTING METHOD

(75) Inventors: Eon-Jo Byun, Yongin-si (KR); Yang-Gi Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 12 days.

(21) Appl. No.: 13/445,283

(22) Filed: Apr. 12, 2012

(65) Prior Publication Data

US 2012/0322174 A1    Dec. 20, 2012

(30) Foreign Application Priority Data

Jun. 15, 2011   (KR) .................. 10-2011-0058050

(51) Int. Cl.
*H01L 21/66*      (2006.01)
(52) U.S. Cl.
USPC .................................... 438/15; 257/E21.529
(58) Field of Classification Search
USPC .................................... 438/15; 257/E21.529
See application file for complete search history.

(56) References Cited

U.S. PATENT DOCUMENTS

| | | | |
|---|---|---|---|
| 6,621,161 B2* | 9/2003 | Miyawaki | 257/723 |
| 2003/0029921 A1* | 2/2003 | Akita et al. | 235/492 |
| 2010/0129954 A1* | 5/2010 | Kong | 438/65 |

FOREIGN PATENT DOCUMENTS

| | | |
|---|---|---|
| JP | 7-098361 A | 4/1995 |
| JP | 4137471 B2 | 8/2008 |
| JP | 2008-309540 A | 12/2008 |

* cited by examiner

*Primary Examiner* — Phuc Dang
(74) *Attorney, Agent, or Firm* — Harness, Dickey & Pierce, P.L.C.

(57) ABSTRACT

A chip testing method includes cutting a wafer into chip packages, re-arranging the chip packages on a chip tray, and testing the re-arranged chip packages. The wafer includes a plurality of substrates vertically stacked thereon, and each of the plurality of substrates has a plurality of chips mounted thereon.

18 Claims, 11 Drawing Sheets

CHIP TESTING METHOD

CROSS-REFERENCE TO RELATED APPLICATION

This application claims priority from Korean Patent Application No. 10-2011-0058050 filed on Jun. 15, 2011 in the Korean Intellectual Property Office, and all the benefits accruing therefrom under 35 U.S.C. 119, the contents of which in its entirety are herein incorporated by reference.

BACKGROUND

1. Field

Some example embodiments relate to a chip fixing apparatus and chip testing method using the same.

2. Description of the Related Art

A plurality of integrated circuit devices are arranged on a semiconductor wafer having undergone a series of fabrication processes. The integrated circuit devices may be divided into individual devices by, e.g., a dicing method.

In this case, the individual devices separated through a dicing process, i.e., chips separated from each other through a dicing process, do not have a uniform distance between adjacent chips. Accordingly, testing a plurality of chips at the same time is difficult.

SUMMARY

Some example embodiments provide a chip fixing apparatus and a chip testing method capable of improving process efficiency.

The inventive concepts are not limited thereto, and the inventive concepts will be described in or be apparent from the following description of example embodiments.

According to an example embodiment, a chip testing method includes cutting a wafer into chip packages, re-arranging the chip packages on a chip tray, and testing the re-arranged chip packages. The wafer includes a plurality of substrates vertically stacked thereon, and each of the plurality of substrates has a plurality of chips mounted thereon.

According to another example embodiment, a chip testing method includes cutting a wafer into chip packages, the wafer including a plurality of chips mounted thereon, placing a chip tray on a support chuck, the chip tray having a first vacuum line and the support chuck having a second vacuum line that corresponds with the first vacuum line, re-arranging the chip packages on the chip tray, fixing the chip packages onto the chip tray by forming a vacuum between the chip packages and the chip tray through the first vacuum line, separating the chip tray from the support chuck, transferring the chip tray to a chip testing apparatus, and testing the re-arranged chip packages.

According to another example embodiment, a chip testing method includes cutting a multi-stack wafer into multi-stack chip packages, the multi-stack wafer including a plurality of chips vertically stacked thereon, re-arranging the multi-stack chip packages on a chip tray to form a uniform distance between at least two adjacent multi-stack chip packages, and testing each of the re-arranged multi-stack chip packages.

BRIEF DESCRIPTION OF THE DRAWINGS

The above and other aspects and features of the inventive concepts will become more apparent by describing in detail example embodiments thereof with reference to the attached drawings, in which.

DETAILED DESCRIPTION OF EXAMPLE EMBODIMENTS

The inventive concepts will now be described more fully hereinafter with reference to the accompanying drawings, in which example embodiments are shown. The inventive concepts may, however, be embodied in different forms and should not be construed as limited to example embodiments set forth herein. Rather, example embodiments are provided so that this disclosure will be thorough and complete, and will fully convey the scope of the inventive concepts to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concepts.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or example terms provided herein is intended merely to better illuminate the inventive concepts and is not a limitation on the scope of the inventive concepts unless otherwise specified. Further, unless defined otherwise, all terms defined in generally used dictionaries may not be overly interpreted.

Hereinafter, a chip fixing apparatus and a chip testing apparatus including the same in accordance with an example embodiment will be described with reference to FIGS. 1 to 6.

Figure 1:
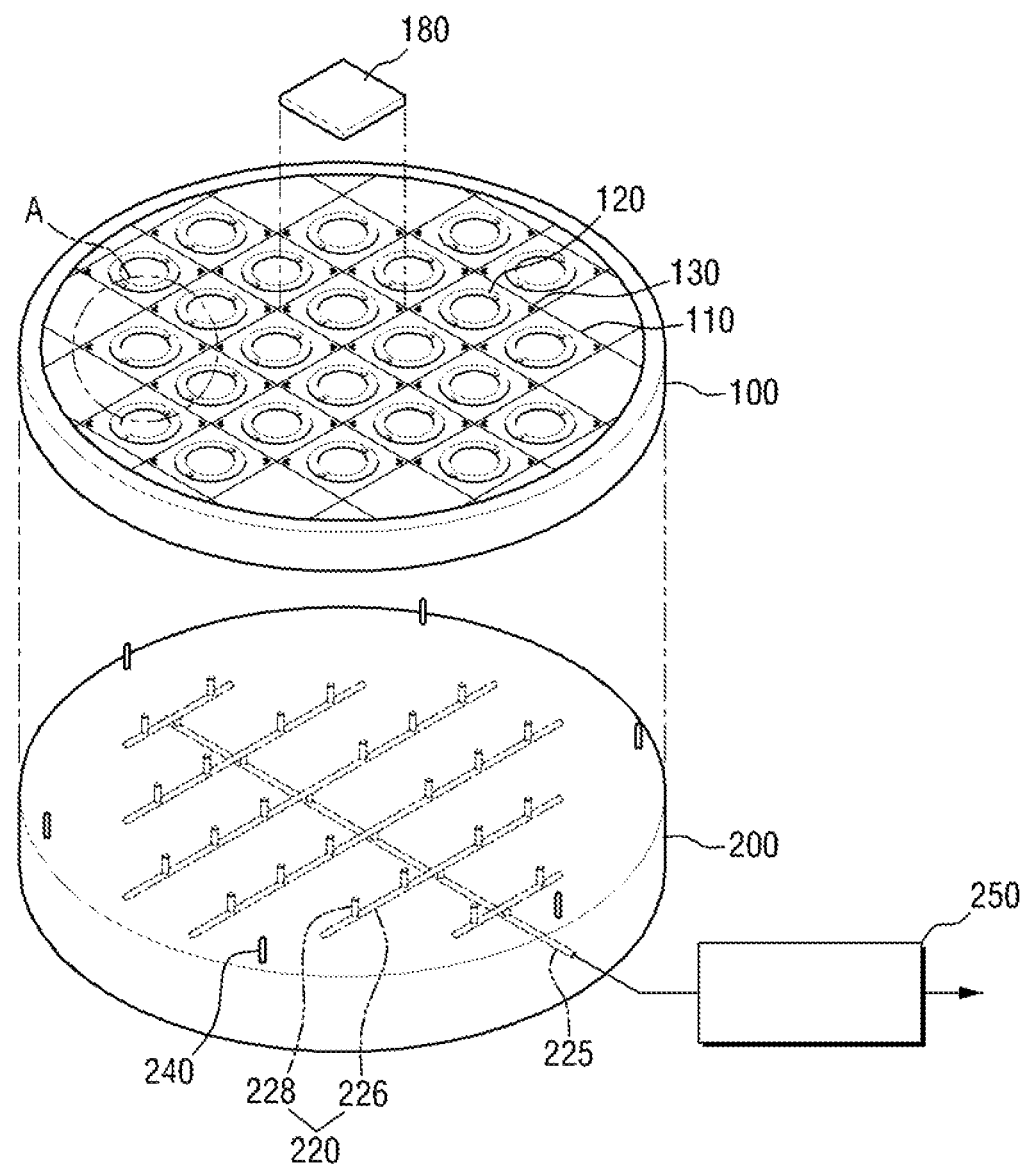
FIG. 1 is a perspective view illustrating a chip fixing apparatus in accordance with an example embodiment.
Figure 2:
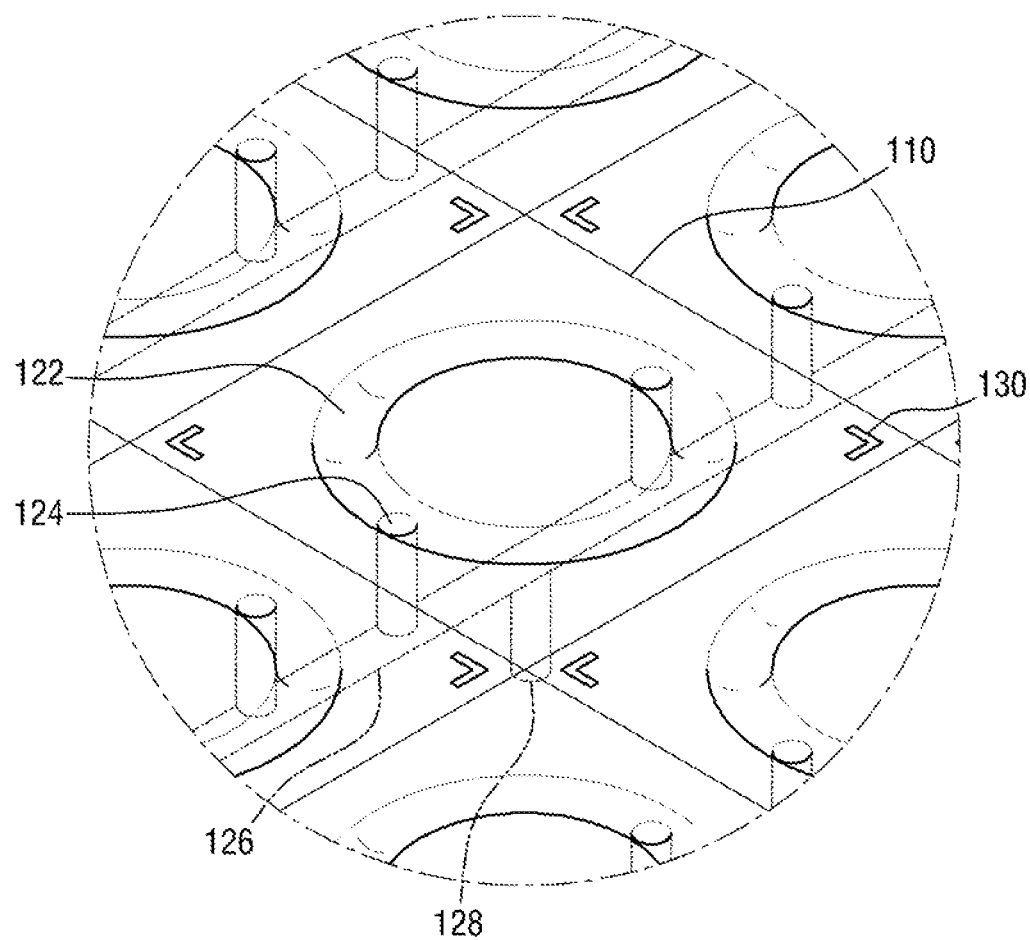
FIG. 2 is a partial enlarged view of portion A of FIG. 1.
Figure 3:
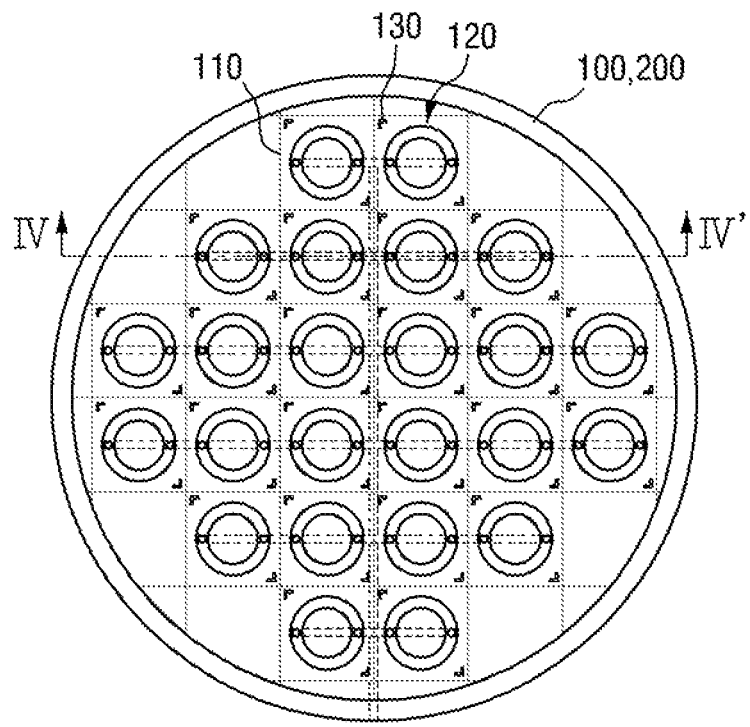
FIG. 3 is a plan view illustrating the chip fixing apparatus of FIG. 1.
Figure 4:
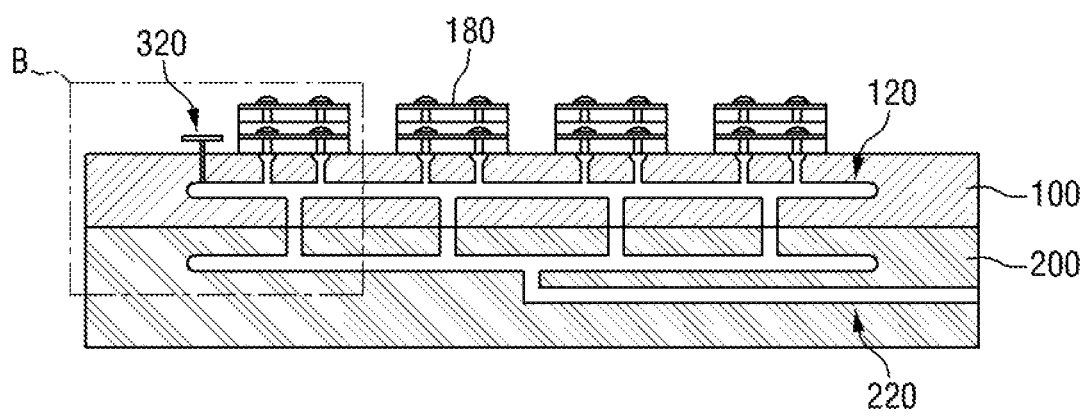
FIG. 4 is a cross-sectional view taken along line IV-IV' of FIG. 3.
Figure 5:
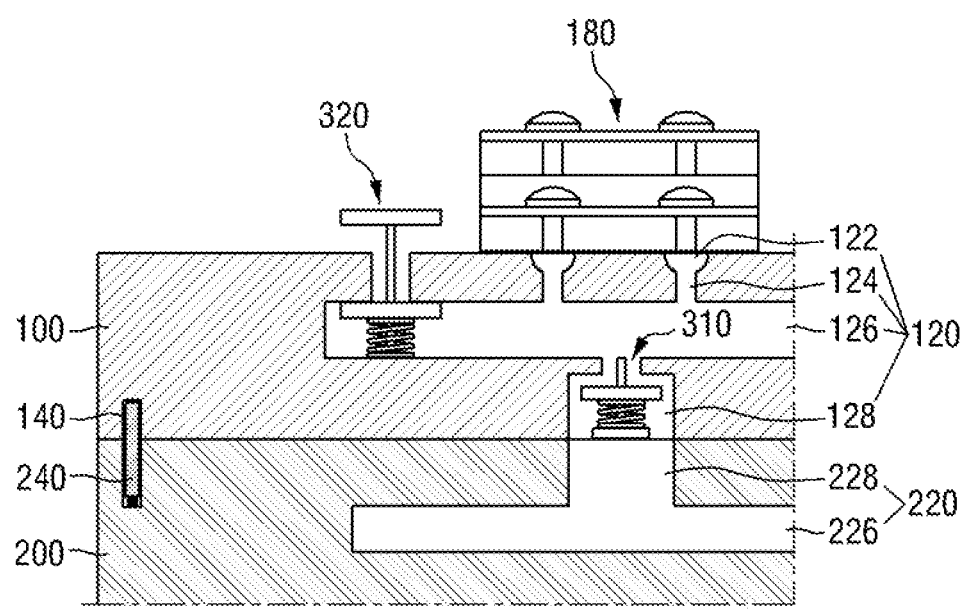
FIG. 5 is a partial enlarged view of portion B of FIG. 4.
Figure 6:
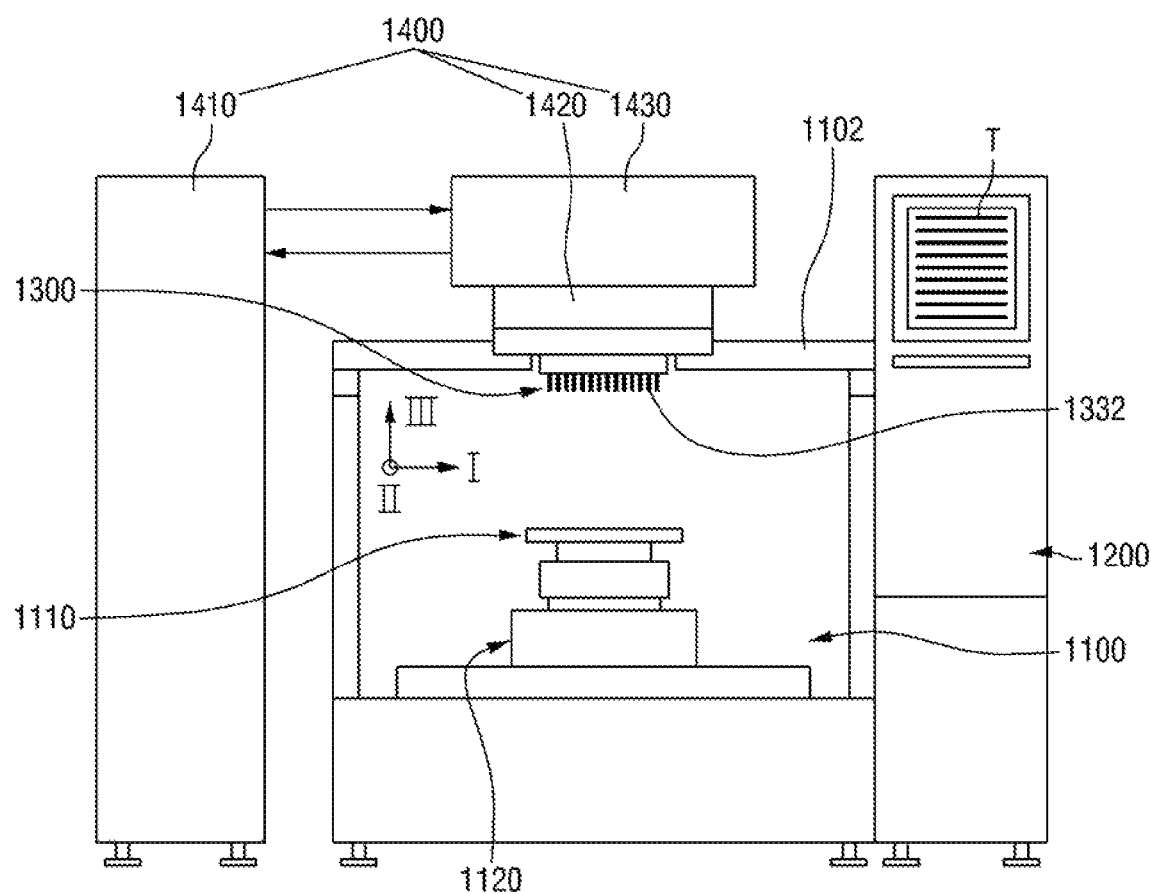
FIG. 6 is a diagram of a chip testing apparatus including the chip fixing apparatus in accordance with an example embodiment.

FIG. 1 is a perspective view illustrating a chip fixing apparatus in accordance with an example embodiment. FIG. 2 is a partial enlarged view of portion A of FIG. 1. FIG. 3 is a plan view illustrating the chip fixing apparatus of FIG. 1. FIG. 4 is a cross-sectional view taken along line IV-IV' of FIG. 3. FIG. 5 is a partial enlarged view of portion B of FIG. 4. FIG. 6 is a diagram of a chip testing apparatus including the chip fixing apparatus in accordance with an example embodiment.

Referring to FIG. 1, the chip fixing apparatus according to an example embodiment includes a chip tray 100 on which a plurality of field regions 110 are defined, the chip tray 100 having a first vacuum line 120 therein, and a support chuck 200 having a second vacuum line 220 therein and supporting the chip tray 100.

The field regions 110 to which a plurality of chip packages 180 are attached respectively are defined on the chip tray 100. The term "chip packages" refers to a multi-stack chip in which a plurality of single chips are stacked. Each of the chips of the chip packages 180, which are to be attached onto the chip tray 100, may be, e.g., a semiconductor chip. The semiconductor chip may be fabricated using silicon, silicon on insulator (SOI), silicon germanium or the like, but example embodiments are not limited thereto. Although not shown specifically, multi-layer wiring, transistors, passive elements and the like may be integrated in the chip packages 180. The field regions 110 may be arranged in a matrix shape including a plurality of rows and a plurality of columns. The chip packages 180 are arranged corresponding to the field regions 110, respectively. Align marks 130 may be formed on the field regions 110 such that the chip packages 180 can be accurately arranged on the chip tray 100.

The first vacuum line 120 is evacuated to vacuum through the second vacuum line 220. Specifically, the first vacuum line 120 may not be directly connected to a vacuum pump 250. In this case, the first vacuum line 120 may be evacuated to vacuum through the second vacuum line 220 connected to the vacuum pump 250. More specifically, when the chip tray 100 is coupled to the support chuck 200, gas existing in the first vacuum line 120 and the second vacuum line 220 can be sucked through the second vacuum line 220. Accordingly, the first vacuum line 120 and the second vacuum line 220 are in a vacuum state. When the chip tray 100 is separated from the support chuck 200, the first vacuum line 120 may independently maintain the vacuum state. A detailed description thereof will be given later with reference to FIGS. 4 and 5.

As shown in FIG. 2, the first vacuum line 120 may include a field vacuum line 122 formed on the surface of the chip tray 100, the first inner vacuum line 126 formed in the chip tray 100, and first vacuum holes 124 connecting the field vacuum line 122 with the first inner vacuum line 126.

As shown in FIGS. 2 and 3, the field vacuum line 122 may include a plurality of closed curves. Although the field vacuum line 122 has circular curves in the drawings, example embodiments are not limited thereto. Further, at least one of the closed curves may be arranged in each of the field regions 110.

More specifically, the field vacuum line 122 may be formed as a trench to be recessed from the surface of the chip tray 100. As shown in FIG. 2, a space may be formed between the chip packages 180 and the chip tray 100 by the field vacuum line 122 recessed from the surface. Accordingly, when the chip packages 180 are arranged on the chip tray 100 and the first vacuum line 120 has a vacuum state, the space between the chip packages 180 and the chip tray 100 also has a vacuum state such that the chip packages 180 can be adsorbed and fixed onto the chip tray 100. The chip tray 100 may be separated from the support chuck 200 by using a lift pin 240 installed on the support chuck 200. The lift pin 240 is inserted into an opening 140 at an outer portion of the chip tray 100.

The field vacuum line 122 may be connected to the first inner vacuum line 126 formed in the chip tray 100 via the first vacuum holes 124. Further, second vacuum holes 128 may be formed to pass through the opposite surface of the chip tray 100 from the first inner vacuum line 126.

The second vacuum holes 128 may be formed to correspond to the second vacuum line 220 formed in the support chuck 200. In this case, forming the second vacuum holes 128 to correspond to the second vacuum line 220 may include arranging the second vacuum holes 128 to enable air flow between the first vacuum line 120 in the chip tray 100 and the second vacuum line 220 in the support chuck 200 through the second vacuum holes 128.

As described above, since the first vacuum line 120 is evacuated to vacuum through the second vacuum line 220, the second vacuum holes 128 may serve as a path allowing gas, e.g., air, to move between the first vacuum line 120 and the second vacuum line 220.

As shown in FIG. 1, the second vacuum line 220 may include a second inner vacuum line 226 formed in the support chuck, and third vacuum holes 228 providing connection to the second inner vacuum line 226 from the surface of the support chuck 200. In this case, the third vacuum holes 228 of the support chuck 200 may be arranged to correspond to the second vacuum holes 128 of the chip tray 100 to enable gas flow between the first vacuum line 120 and the second vacuum line 220.

As shown in FIGS. 4 and 5, the second vacuum line 220 of the support chuck 200 is connected to the first vacuum line 120 of the chip tray 100. Each of the chip packages 180 may be vacuum adsorbed onto the chip tray 100 by the first vacuum line 120. Specifically, referring to FIG. 5, the second vacuum line 220 of the support chuck 200 may include the second inner vacuum line 226 and the third vacuum holes 228 extending from the second inner vacuum line 226 to the surface of the support chuck 200.

Further, as described above, the first vacuum line 120 of the chip tray 100 may include the first inner vacuum line 126, and the field vacuum line 122 extending from the first inner vacuum line 126 to the surface of the chip tray 100 to form a space between the chip packages 180 and the surface of the chip tray 100. Further, the first vacuum line 120 may include the first vacuum holes 124 connecting the first inner vacuum line 126 with the field vacuum line 122, and the second vacuum holes 128 extending from the first inner vacuum line 126 toward the support chuck 200 and corresponding to the second vacuum line 220, more specifically, the third vacuum holes 228.

Further, a first valve 310 may be installed between the first vacuum line 120 and the second vacuum line 220. The first valve 310 may serve to separate the first vacuum line 120 from the second vacuum line 220. In this case, separating the first vacuum line 120 from the second vacuum line 220 may mean blocking air flow between the first vacuum line 120 and the second vacuum line 220. As described above, the first vacuum line 120 is evacuated to vacuum through the second vacuum line 220. If the first valve 310 is in a closed state, the vacuum state of the first vacuum line 120 may be maintained. That is, the vacuum state of the first vacuum line 120 can be independently maintained.

In this case, independently maintaining the vacuum state of the first vacuum line 120 may mean maintaining the vacuum state without using a gas sucking device such as a vacuum pump. Accordingly, even though the chip tray 100 is separated from the support chuck 200, the chip packages 180 may be stably adsorbed onto the chip tray 100. That is, the chip packages 180 may be more easily moved by moving only the chip tray 100.

Further, the first vacuum line 120 may be provided with a second valve 320 which releases the vacuum of the first vacuum line 120. In a case where the second valve 320 is opened by an external signal or external operation, the vacuum of the first vacuum line 120 can be released. Accordingly, the chip packages 180 which are vacuum adsorbed and fixed onto the chip tray 100 may be detached from the chip tray 100.

The chip testing apparatus including the chip fixing apparatus in accordance with an example embodiment will be described with reference to FIG. 6. Referring to FIG. 6, the chip testing apparatus in accordance with an example embodiment may include a probing unit 1100, a loading unit 1200, a probe card 1300, and a tester 1400.

The probing unit 1100 may provide a space in which a process of inspecting the electrical characteristics of the semiconductor chips, e.g., an EDS process, is conducted. The loading unit 1200 may be arranged adjacent to the probing unit 1100 at one side of the probing unit 1100. The loading unit 1200 may receive a chip tray T on which semiconductor chips to be inspected are arranged, and transfer the chip tray T to the probing unit 1100.

The probe card 1300 may be disposed at an upper wall 1102 of the probing unit 1100. A substrate support unit 1110 may be placed in the probing unit 1100 to face the probe card 1300. The chip tray T transferred from the loading unit 1200 may be disposed on the substrate support unit 1110. As described with reference to FIGS. 1 to 5, the first vacuum line of the chip tray T independently maintains a vacuum state such that a plurality of chips are adsorbed and fixed on the chip tray T. Accordingly, the chip tray T may be transferred to the substrate support unit 1110 while a plurality of chips are fixed on the chip tray T.

The substrate support unit 1110 may be installed on a transfer unit 1120. The transfer unit 1120 may linearly move the substrate support unit 1110 in horizontal directions I and II and in a vertical direction III and rotate the substrate support unit 1110 around a central axis perpendicular to the plane of the chip tray. In this case, the horizontal directions I and II may be directions in which semiconductor devices are arranged on the plane of the chip tray, and the vertical direction III may be a direction perpendicular to the plane of the chip tray.

As the substrate support unit 1110 is rotated by the transfer unit 1120, the arrangement direction of electrode pads of the semiconductor devices disposed on the chip tray may be aligned in the arrangement direction of probes 1332 of the probe card 1300. As the substrate support unit 1110 is moved in the horizontal directions I and II by the transfer unit 1120, the electrode pads of the semiconductor devices disposed on the chip tray may be aligned below the probes 1332 of the probe card 1300 such that the electrode pads are probes 1332 are aligned in a vertical direction.

As the substrate support unit 1110 is linearly moved in a vertical direction by the transfer unit 1120, the electrode pads of the semiconductor devices disposed on the chip tray may be in physical contact with the probes 1332 of the probe card 1300. Contact marks are formed on the pads by the physical contact between the probes 1332 and the pads. For example, the contact marks may be formed on central portions of pads. In order to check the contact marks, a photographing unit (not shown) such as a camera may be used.

The tester 1400 may include a tester main body 1410 arranged at the other side of the probing unit 1100, and a tester head 1430 electrically connected to the tester main body 1410. The tester head 1430 may have a base 1420 to which the probe card 1300 is connected. The tester main body 1410 may apply an electrical signal for inspection of the semiconductor devices to the probe card 1300 via the tester head 1430 and the base 1420, and receive a signal transmitted from the probe card 1300 in response to the applied electrical signal, thereby determining whether the semiconductor devices have defects.

In the chip fixing apparatus and the chip testing apparatus including the same in accordance with an example embodiment, a plurality of chips are vacuum adsorbed onto the chip tray and the chip tray can independently maintain a vacuum state, thereby easily fixing a plurality of chip packages on the chip tray. Accordingly, by maintaining the vacuum state of the vacuum line, even though the chip tray is transferred while being separated from the support chuck, a plurality of chip packages fixed on the chip tray can also be transferred at the same time.

Further, when multi-stack chips are formed by stacking a plurality of wafers, and a cutting process of the wafers is performed to separate individual chip packages, distances between adjacent multi-stack chip packages may be different. Accordingly, by re-arranging the multi-stack chip packages on the chip tray on which a plurality of field regions are defined, distances between chip packages may become uniform. Thus, a plurality of probes can be stably in contact with the corresponding chip packages.

Figure 7:
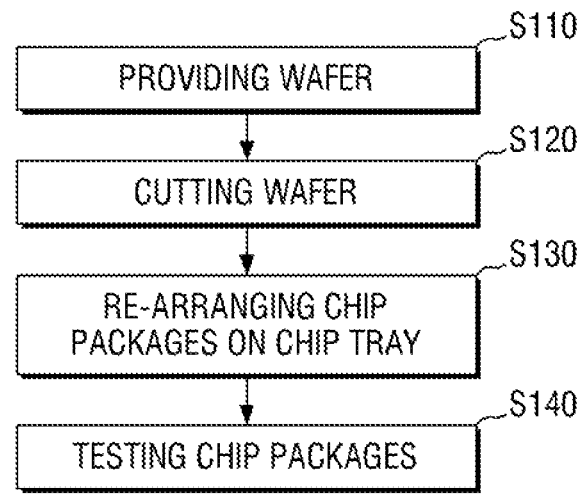
FIG. 7 is a flowchart illustrating a chip testing method in accordance with an example embodiment.

Hereinafter, a chip testing method in accordance with an example embodiment will be described with reference to FIGS. 7 to 12. FIG. 7 is a flowchart illustrating a chip testing method in accordance with an example embodiment. FIGS. 8 to 12 are cross-sectional views illustrating the chip testing method in accordance with an example embodiment.

Figure 8:
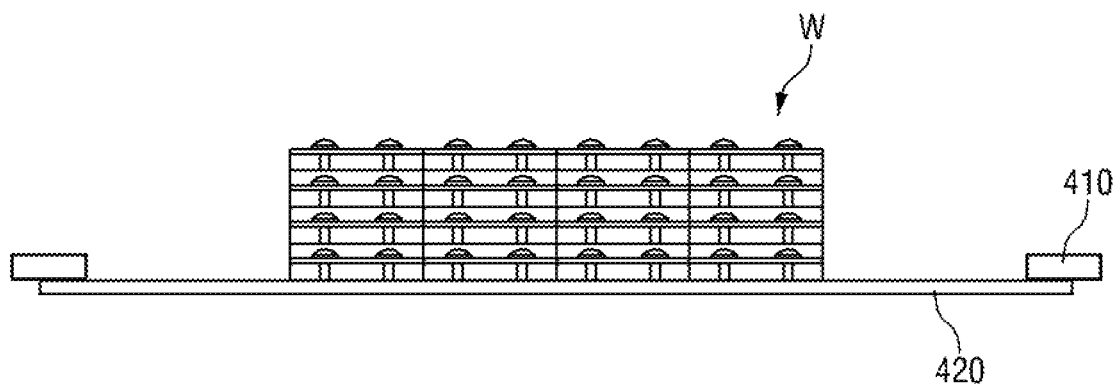
FIGS. 8 to 12 are cross-sectional views illustrating the chip testing method in accordance with an example embodiment.

Referring to FIGS. 7 and 8, there is provided a wafer in which a plurality of substrates, each having a plurality of chip packages mounted thereon, are vertically stacked (step S110).

Specifically, as shown in FIG. 8, a semiconductor wafer W having undergone a series of fabrication processes may be provided onto a frame 410. That is, the wafer W may be disposed on a wafer support unit including a frame 410 (e.g., ring-shaped frame) larger than the wafer W, and a support film 420 (e.g., die attach film (DAF)) fixed by the frame 410. The support film 420 may be formed to have the same size as the frame 410. The frame 410 is attached to one surface of the support film 420, and the wafer W may be adhered to one surface of the support film 420 exposed by the frame 410.

A semiconductor substrate on which a plurality of chip packages are arranged lengthwise and crosswise, and a semiconductor wafer W in which a plurality of semiconductor substrates are vertically stacked may be attached to a central portion of the wafer support unit, i.e., a central portion of the support film 420 exposed by the frame 410. Accordingly, when the semiconductor wafer W is cut by a cutting process that will be described later, the semiconductor wafer W can be divided into a plurality of multi-stack chips.

Subsequently, referring to FIGS. 7, 9 and 10, the wafer is cut into respective chip packages (step S120).

Figure 9:
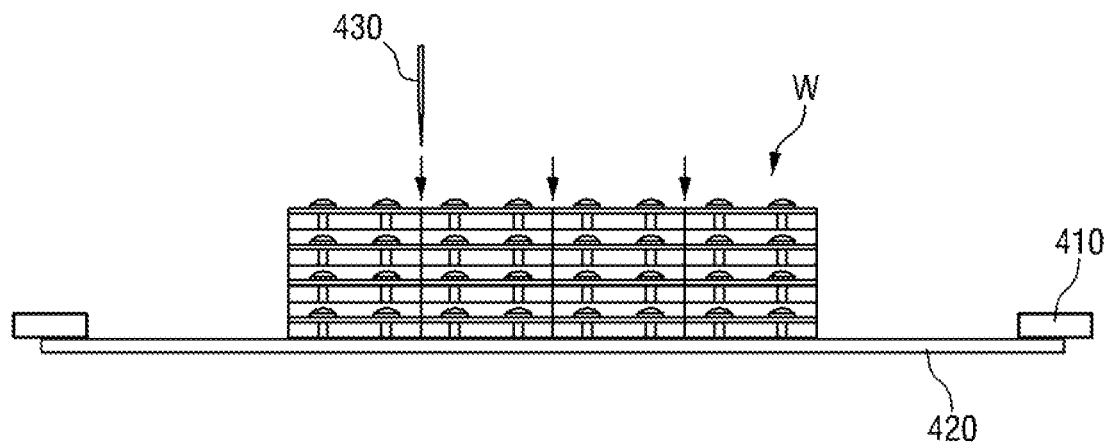

As shown in FIG. 9, the wafer W disposed on the wafer support unit may be cut along a scribe line of the wafer W by using a cutting unit (e.g., blade 430). Accordingly, the wafer W may be divided into individual multi-stack chips.

Figure 10:
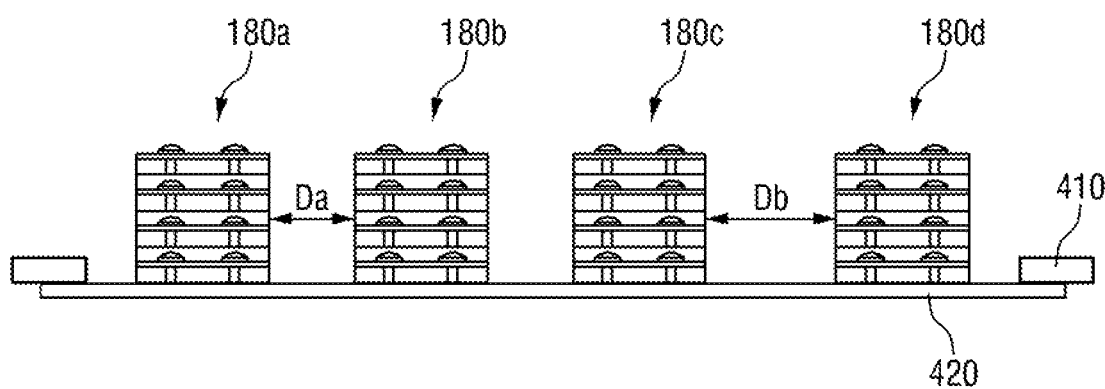

In this case, as shown in FIG. 10, in the chip packages 180 separated by cutting, at least two distances of the distances between adjacent chip packages may be different. Specifically, in the separated chip packages 180, a distance between chip packages, i.e., a distance Da between a first chip package 180a and a second chip package 180b may be different from a distance Db between a third chip 180c and a fourth chip 180d. The wafer W and a part of the support film 420 may be cut when the wafer W disposed on the support film 420 is cut into a plurality of chip packages.

More specifically, in order to completely divide the wafer W into the chip packages 180, the cutting process may be performed such that the blade 430 passes through a bottom surface of the wafer W in contact with the support film 420. Accordingly, when the blade 430 passes through the bottom surface of the wafer W, a part of the support film 420 may be cut at the same time by the blade 430. In this case, the depth of the support film 420 cut by the blade 430 may be different and an external force, e.g., tensile force, applied to each region may be different. Accordingly, distances between chip packages after the cutting process become non-uniform. In addition to the cut depth of the support film 420 and the force applied to the support film 420, there may be various factors to separate the adjacent chip packages. Consequently, after the cutting process is performed on the wafer W, the distances between the chip packages 180 become non-uniform.

Figure 11:
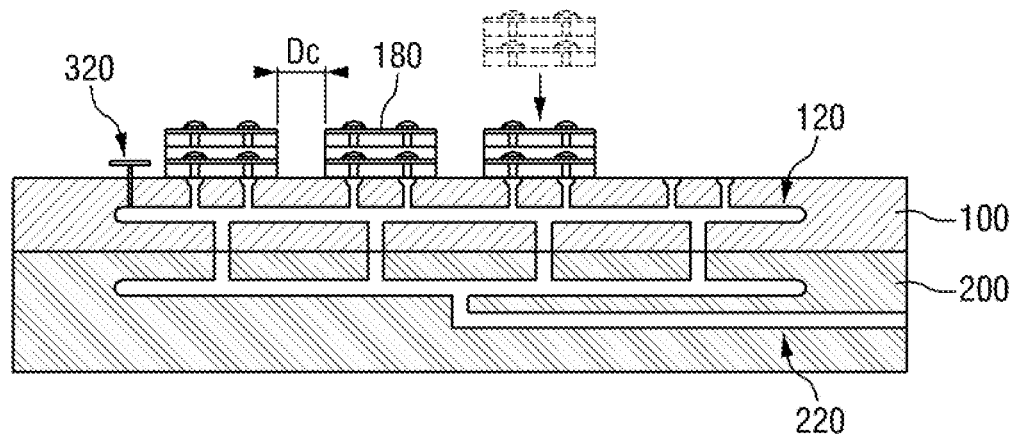

Then, referring to FIGS. 7 and 11, the chip packages are re-arranged on the chip tray 100 (step S130).

As shown in FIG. 11, in the re-arranged chip packages 180, the distances between the adjacent chip packages may be uniform. In other words, the chip packages 180 may be re-arranged such that the distances Dc between the re-arranged chip packages are uniform. As described above with reference to FIG. 1, the field regions 110 (see FIG. 1) may be defined on the surface of the chip tray 100. Each of the chip packages 180 may be arranged to correspond to each of the field regions 110. Further, the align marks 130 may be formed in the field regions 110. Accordingly, when the chip packages 180 are re-arranged on the chip tray 100, the arrangement may be conducted using the align marks 130 such that the distances between the chip packages 180 are uniform.

In other words, the field regions 110 on which the chip packages 180 will be arranged respectively may be defined on the upper surface of the chip tray 100. The chip packages 180 may be re-arranged on the chip tray 100 at uniform intervals by arranging the cut chip packages 180 in the field regions 110 respectively. Further, the chip packages 180 can be arranged using the align marks 130 respectively formed in the field regions 110.

As described above, each of the chip packages 180 may be a multi-stack chip in which a plurality of single chips are stacked. For example, the multi-stack chip may be formed by trough silicon via (TSV) technology. However, the structure of the multi-stack chip is not limited to the structure stacked using TSV. That is, some example embodiments may be applied to multi-stack chip packages having the structure stacked by various methods.

As illustrated in the drawings, the chip tray 100 may be placed on the support chuck 200. The chip tray 100 may have the first vacuum line 120 therein and the support chuck 200 may have the second vacuum line 220 therein. As described above, after the chip tray 100 is coupled onto the support chuck 200, the first vacuum line 120 and the support chuck 200 may be evacuated to vacuum by using the vacuum pump 250 (see FIG. 1) connected to the second vacuum line 220 by a common line 225. Accordingly, the chip packages 180 may be vacuum adsorbed onto the chip tray 100, and even though the chip tray 100 is separated from the support chuck 200, the first vacuum line 120 independently maintains a vacuum state so that the chip packages 180 can maintain a fixed state on the chip tray 100.

Subsequently, referring to FIGS. 7 and 12, the re-arranged chip packages 180 are tested (step S140).

More specifically, the chip tray 100 on which the chip packages 180 are re-arranged at uniform intervals is transferred into a chip testing apparatus (not shown) to test the electrical characteristics of the chip packages 180. The chip tray 100 may be supported by the substrate support unit 1110.

Figure 12:
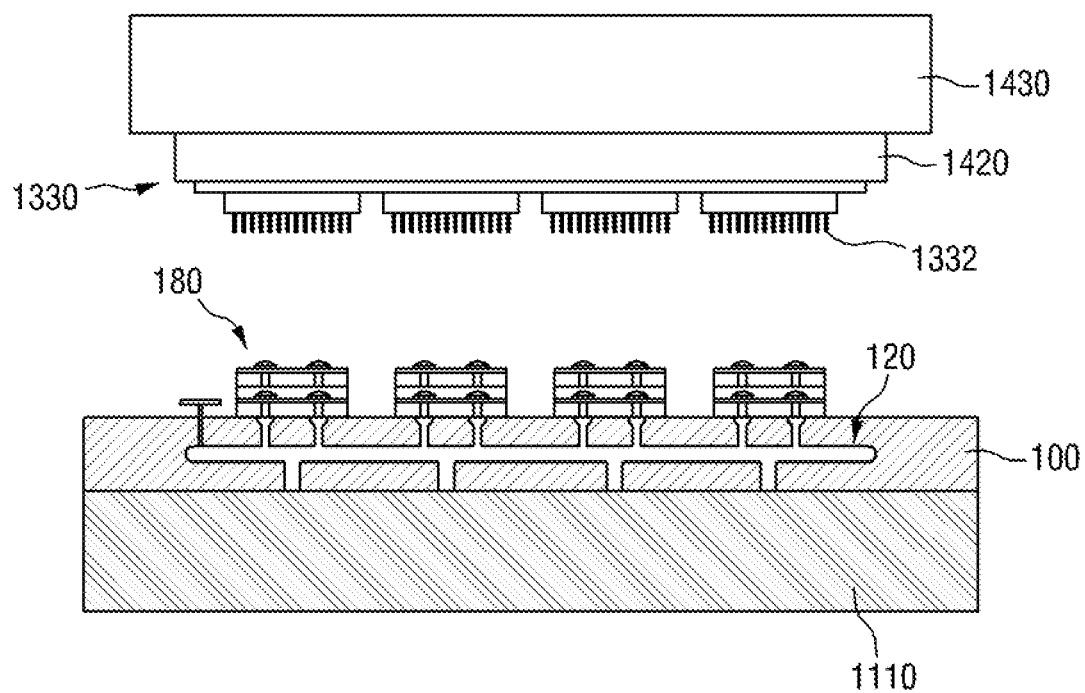

As shown in FIG. 12, a socket 1330 may be installed on the base 1420, and the base 1420 may be mounted on the tester head 1430. The probes 1332 may be arranged on the socket 1330. In a multi-test apparatus in which the probes 1332 are arranged at regular intervals, the targets to be tested may be arranged corresponding to the intervals of the probes 1332. Accordingly, in the chip testing method in accordance with an example embodiment, the chip packages 180 are re-arranged on the chip tray 100 at uniform intervals, so that the chip test can be stably conducted.

Further, a test may be conducted on a plurality of chips arranged on each semiconductor substrate. However, since a plurality of semiconductor substrates are stacked vertically, chip defects may occur when the chips mounted on the semiconductor substrates are electrically connected to each other in a vertical direction. Accordingly, according to an example embodiment, the wafer in which a plurality of semiconductor substrates are stacked is cut and divided into a plurality of multi-stack chip packages. The chip packages are re-arranged on the chip tray and a test for electrical characteristics of the chips is conducted to thereby sort good chips. Accordingly, increasing a ratio of good products in a chip unit sale is possible.

Figure 13:
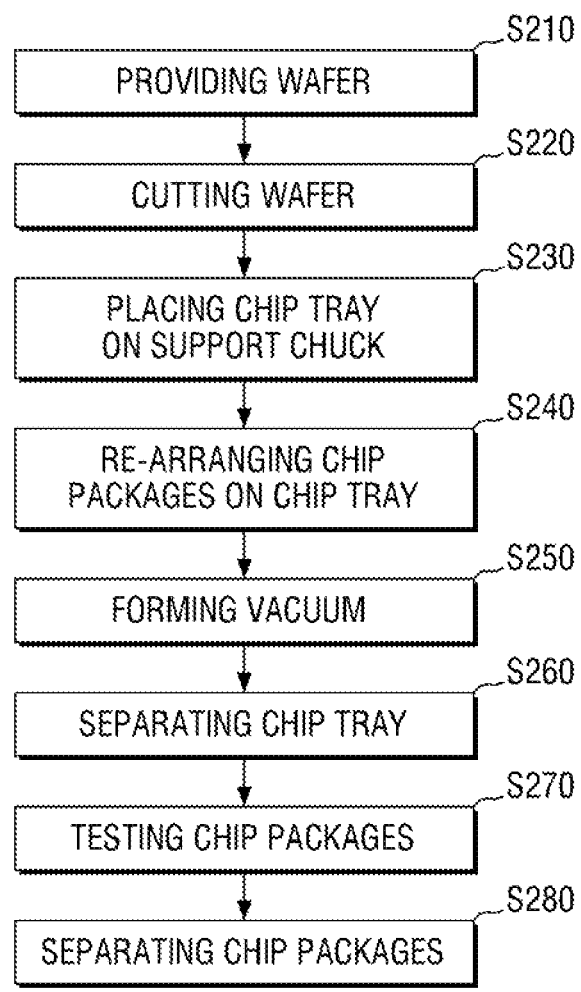
FIG. 13 is a flowchart illustrating a chip testing method in accordance with another example embodiment.

Hereinafter, a chip testing method in accordance with another example embodiment will be described with reference to FIGS. 13 to 17. FIG. 13 is a flowchart illustrating a chip testing method in accordance with another example embodiment. FIGS. 14 to 17 are cross-sectional views illustrating the chip testing method in accordance with another example embodiment. For convenience of explanation, a detailed description on substantially the same components as those of the above-described embodiments will be omitted or simplified.

Figure 14:
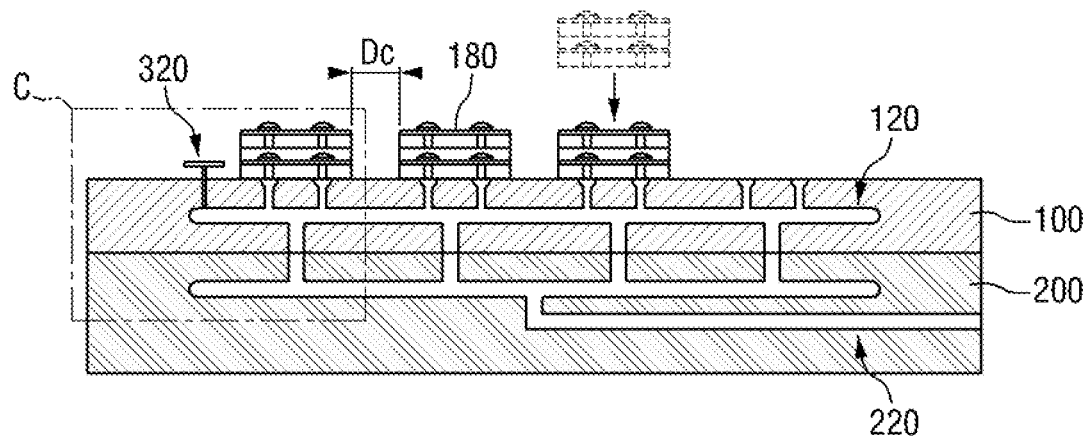
FIGS. 14 to 17 are cross-sectional views illustrating the chip testing method in accordance with another example embodiment.

Referring to FIGS. 13 and 14, a wafer is provided (step S210), and the wafer is cut into a plurality of chip packages (step S220). The chip tray 100 is placed on the support chuck 200 (step S230), and the cut chip packages 180 are re-arranged on the chip tray 100 (step S240).

Providing the wafer W on which the chip packages 180 are mounted and cutting the wafer W into the respective chip packages 180 are substantially the same as the steps of the chip testing method in accordance with the above-described embodiment. That is, the wafer W on which the chip packages 180 are mounted may be disposed on the wafer support unit including the frame 410 and the support film 420. Subsequently, the wafer may be cut and divided into the respective chip packages 180 by using a cutting unit, e.g., a blade. As described above, the separated chip packages 180 may have non-uniform distances between chip packages.

As shown in FIG. 14, the chip tray 100 may be placed on the support chuck 200, and the cut chip packages 180 may be re-arranged on the chip tray 100. As described above, the chip tray 100 has the first vacuum line 120 therein and the support chuck 200 has the second vacuum line 220 therein. In this case, when the chip tray 100 is placed on the support chuck 200, the first vacuum line 120 of the chip tray 100 may be connected to the second vacuum line 220 of the support chuck 200. That is, the chip tray 100 is placed such that the first vacuum line 120 of the chip tray 100 corresponds to the second vacuum line 220 of the support chuck 200. In this case, connecting the first vacuum line 120 with the second vacuum line 220, and arranging the first vacuum line 120 corresponding to the second vacuum line 220 may mean connecting the first vacuum line 120 and the second vacuum line 220 with each other to enable gas flow between the first vacuum line 120 and the second vacuum line 220. The vacuum of the first vacuum line 120 may be released by opening the second valve 320 connected to the first vacuum line 120

The cut chip packages 180 may be re-arranged on the chip tray 100 to have a uniform distance Dc. As described above, since the cut chip packages 180 have non-uniform distances between them on the wafer support unit, the distances between the chip packages may be uniform by re-arranging the chip packages 180 on the chip tray 100. Accordingly, the chip test can be more stably conducted in the testing process that will be described later.

Figure 15:
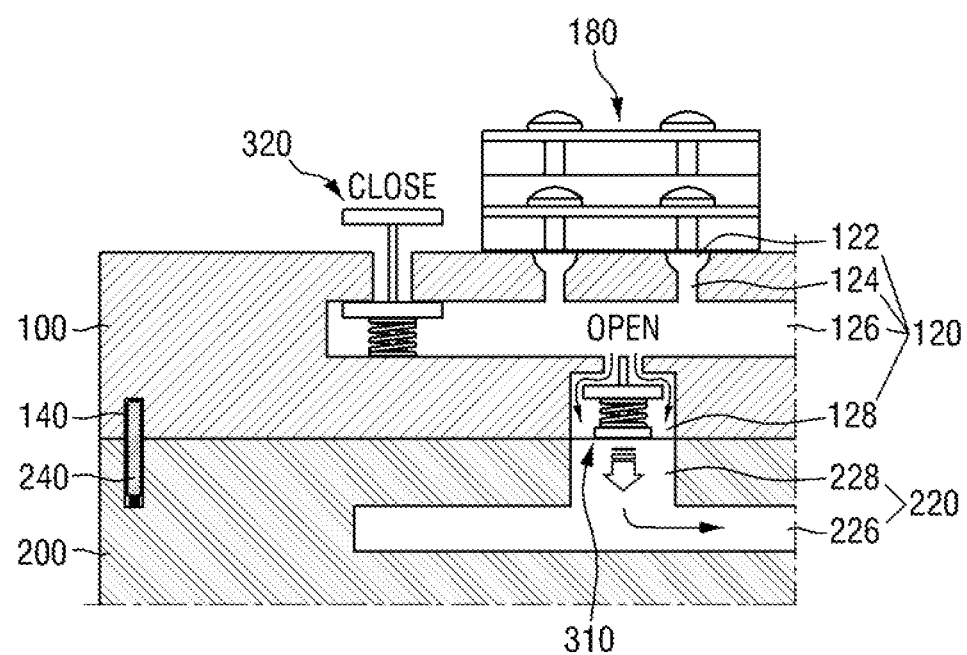

FIG. 15 is a partial enlarged view of portion 'C' of FIG. 14. Referring to FIGS. 13 and 15, a vacuum is formed between the chip packages 180 and the chip tray 100 such that the chip packages 180 are fixed on the chip tray 100 (step S250).

Specifically, a vacuum may be formed between the chip packages 180 and the chip tray 100 through the first vacuum line 120. While the chip tray 100 is coupled onto the support chuck 200, a vacuum may be formed in the first vacuum line 120 and the second vacuum line 220 by using the vacuum pump 250 (see FIG. 1) connected to the second vacuum line 220. In this case, the chip tray 100 may be separated from the support chuck 200 by using a lift pin 240 installed on the support chuck 200. The lift pin 240 is inserted into an opening 140 at an outer portion of the chip tray 100.

As shown in FIG. 15, the chip tray 100 may include the first valve 310 installed between the first vacuum line 120 and the second vacuum line 220. The first valve 310 may serve to spatially separate the first vacuum line 120 from the second vacuum line 220. The first vacuum line 120 may be provided with a second valve 320 which releases the vacuum of the first vacuum line 120. The second vacuum line 220 may include a second inner vacuum line 226 formed in the support chuck 200, and third vacuum holes 228 providing connection to the second inner vacuum line 226 from the surface of the support chuck 200.

In other words, the first valve 310 may be opened or closed to enable air flow or separation between the first vacuum line 120 and the second vacuum line 220. After the chip tray 100 is placed on the support chuck 200, while the vacuum pump 250 (see FIG. 1) sucks air existing in the first vacuum line 120 and the second vacuum line 220, the first valve 310 may maintain an open state and the second valve 320 may maintain a closed state. The first vacuum line 120 may include a field vacuum line 122 formed on the surface of the chip tray 100, the first inner vacuum line 126 formed in the chip tray 100, and first vacuum holes 124 connecting the field vacuum line 122 with the first inner vacuum line 126. Second vacuum holes 128 may be formed to pass through the opposite surface of the chip tray 100 from the first inner vacuum line 126.

That is, the vacuum may be formed between the chip packages 180 and the chip tray 100, more specifically, in the field vacuum line 122 by sucking air existing in the first vacuum line 120 and the second vacuum line 220 through the vacuum pump 250 (see FIG. 1) while the first valve 310 is in an open state. Accordingly, the chip packages 180 may be adsorbed and fixed onto the chip tray 100.

Subsequently, referring to FIGS. 13 and 16, the chip tray 100 is separated from the support chuck 200 (step S260).

Figure 16:
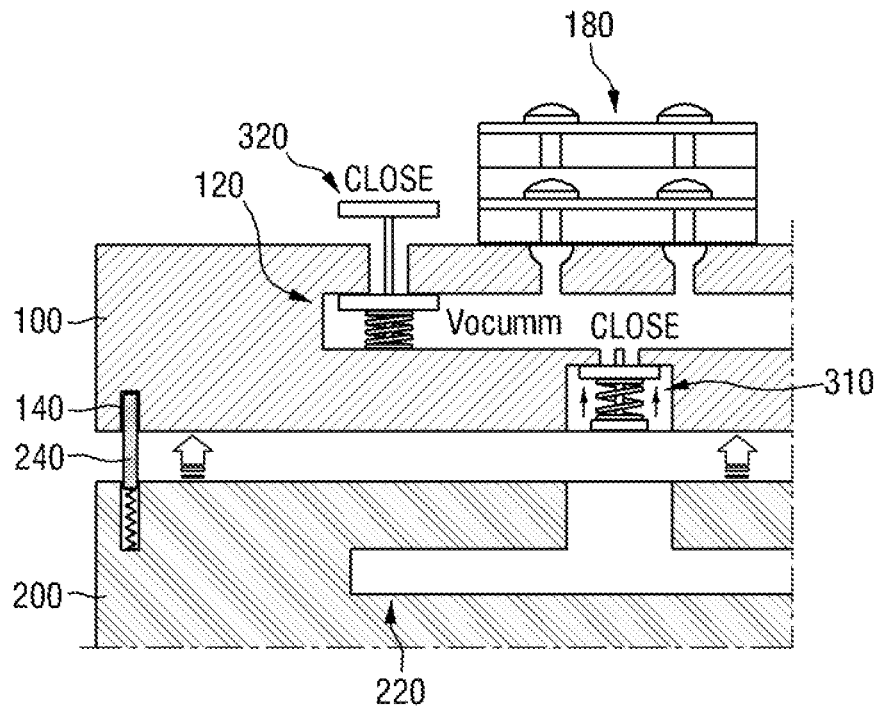

More specifically, as shown in FIG. 16, when the chip tray 100 is separated from the support chuck 200, the first valve 310 is closed by a pressure difference such that the first vacuum line 120 and the second vacuum line 220 can be spatially separated from each other. In other words, the first valve 310, e.g., separation valve, installed between the first vacuum line 120 and the second vacuum line 220 is closed such that the vacuum state of the first vacuum line 120 can be independently maintained.

As the first vacuum line 120 independently maintains the vacuum state, the chip packages 180 may maintain an adsorbed and fixed state onto the chip tray 100. That is, the chip tray 100 separated from the support chuck 200 may maintain the vacuum state of the first vacuum line 120 without additional gas suction, so that the chip packages 180 can be fixed onto the chip tray 100. Accordingly, the chip packages 180 can be more easily moved only by separating and moving the chip tray 100. In other words, the first vacuum line 120 may independently maintain the vacuum state such that the chip packages 180 can be fixed onto the chip tray 100.

In this case, the chip tray 100 may be separated from the support chuck 200 by using a lift pin 240 installed on the support chuck 200. As illustrated in the drawings, the chip tray 100 may be physically detached by elevating the lift pin 240 installed at an outer portion of the support chuck 200. The lift pin 240 is inserted into an opening 140 at an outer portion of the chip tray 100. Although a case where the lift pin 240 applies a force from the upper surface of the support chuck 200 to the lower surface of the chip tray 100 has been illustrated in the drawing, example embodiments are not limited thereto. That is, the chip tray 100 may be separated from the support chuck 200 by various methods in addition to the illustrated method.

Subsequently, referring to FIGS. 13 and 12, the re-arranged chip packages 180 are tested (step S270).

Specifically, the chip packages 180 may be tested by moving the chip tray 100 to the chip testing apparatus. As mentioned in the above embodiment, since the chip packages 180 are re-arranged on the chip tray 100 such that the chip packages 180 are arranged at uniform intervals, the chip packages 180 can be stably tested at the same time by using the chip testing apparatus having the probes 1332.

Subsequently, referring to FIGS. 13 and 17, the chip packages 180 are separated from the chip tray 100 (step S280).

Figure 17:
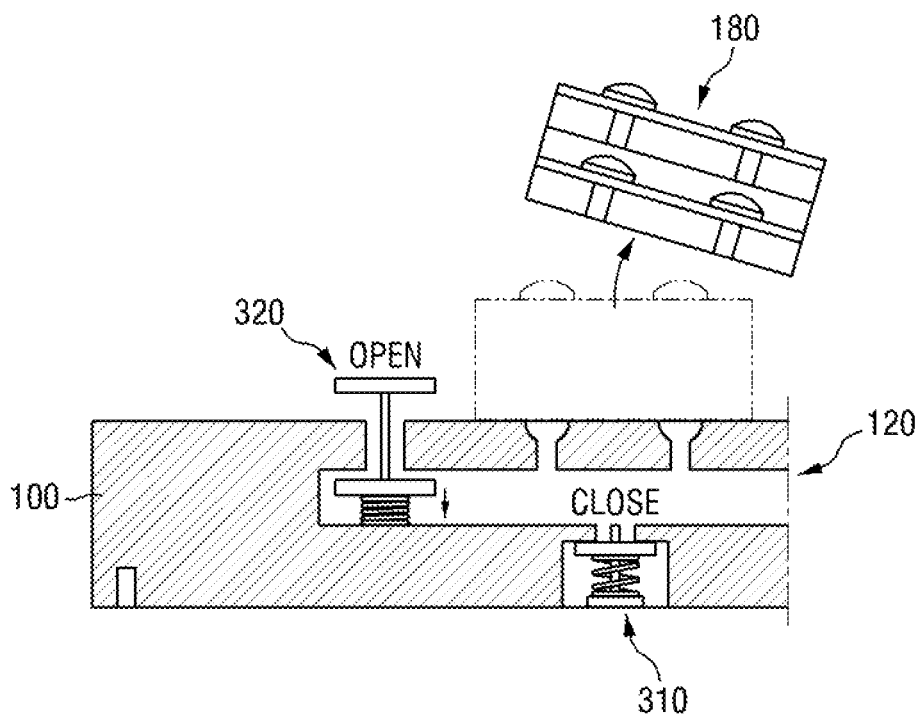

As shown in FIG. 17, the vacuum of the first vacuum line 120 may be released by operating the second valve 320, e.g., main valve for releasing the vacuum of the first vacuum line 120. Specifically, after the test on the chip packages 180 has been completed, the vacuum of the first vacuum line 120 may be released by opening the second valve 320 connected to the first vacuum line 120. Accordingly, the chip packages 180 may be more easily separated that are adsorbed and fixed onto the chip tray 100. Further, when separating the chip packages 180, selectively separating only the good chips determined through the testing process is possible.

In the chip testing method in accordance with another example embodiment, a plurality of chip packages are re-arranged on the chip tray at uniform intervals such that the chip test can be stably conducted. In addition, the test is conducted on each of the multi-stack chip packages after cutting the multi-stack wafer, thereby improving a yield of desirable products.

In concluding the detailed description, those skilled in the art will appreciate that many variations and modifications can be made to example embodiments without substantially departing from the principles of the inventive concepts. Therefore, the disclosed example embodiments are used in a generic and descriptive sense only and not for purposes of limitation.

What is claimed is:

1. A chip testing method comprising:
cutting a wafer into chip packages, the wafer including a plurality of substrates vertically stacked thereon, and each of the plurality of substrates having a plurality of chips mounted thereon;
re-arranging the chip packages on a chip tray; and
testing the re-arranged chip packages,
wherein the chip packages are multi-stack chips, each multi-stack chip having a plurality of single chips stacked on each other,
and the re-arranging arranges the multi-stack chips on the chip tray.

2. The chip testing method of claim 1, wherein the re-arranging arranges the chip packages to form a uniform distance between at least two adjacent chip packages.

3. The chip testing method of claim 2, wherein the wafer is disposed on a support film, and the cutting cuts a portion of the support film.

4. A chip testing method comprising:
cutting a wafer into chip packages, the wafer including a plurality of substrates vertically stacked thereon, and each of the plurality of substrates having a plurality of chips mounted thereon;
re-arranging the chip packages on a chip tray; and
testing the re-arranged chip packages,
wherein a plurality of field regions are defined on an upper surface of the chip tray, and the re-arranging arranges the chip packages in respective field regions of the plurality of field regions, and
wherein chip align marks are formed in the respective field regions of the plurality of field regions, and the re-arranging arranges the chip packages using the chip align marks.

5. A chip testing method comprising:
cutting a wafer into chip packages, the wafer including a plurality of substrates vertically stacked thereon, and each of the plurality of substrates having a plurality of chips mounted thereon;
re-arranging the chip packages on a chip tray, the chip tray including a first vacuum line and having a support chuck coupled thereto, the support chuck including a second vacuum line;
operating a vacuum pump to form a vacuum in the first vacuum line and the second vacuum line, the vacuum pump connected to the second vacuum line, and separating the chip tray from the support chuck to allow the first vacuum line to independently maintain the vacuum; and
after the operating, testing the re-arranged chip packages.

6. A chip testing method comprising:
cutting a wafer into chip packages, the wafer including a plurality of chips mounted thereon;
placing a chip tray on a support chuck, the chip tray having a first vacuum line and the support chuck having a second vacuum line that corresponds with the first vacuum line;
re-arranging the chip packages on the chip tray;
fixing the chip packages onto the chip tray by forming a vacuum between the chip packages and the chip tray through the first vacuum line;
separating the chip tray from the support chuck;
transferring the chip tray to a chip testing apparatus; and
testing the re-arranged chip packages.

7. The chip testing method of claim 6, wherein the fixing includes independently maintaining the vacuum in the first vacuum line.

8. The chip testing method of claim 6, wherein the placing connects the first vacuum line and the second vacuum line to each other.

9. The chip testing method of claim 6, further comprising:
operating a vacuum pump to form a vacuum in the first vacuum line and the second vacuum line while the chip tray is coupled to the support chuck, the vacuum pump connected to the second vacuum line,
wherein the separating includes independently maintaining the vacuum in the first vacuum line.

10. The chip testing method of claim 9, wherein the separating closes a separation valve installed between the first vacuum line and the second vacuum line.

11. The chip testing method of claim 9, further comprising:
opening a main valve of the first vacuum line to release the vacuum; and
separating the chip packages from the chip tray after the testing.

12. The chip testing method of claim 6, wherein
the chip packages are multi-stack chips, each multi-stack chip having a plurality of single chips stacked on each other,
the cutting cuts a multi-stack wafer including a plurality of wafers stacked thereon, and
the re-arranging arranges the multi-stack chips on the chip tray.

13. The chip testing method of claim 12, further comprising:
testing at least two chips of the re-arranged multi-stack chips simultaneously using a plurality of probes of the chip testing apparatus after the cutting.

14. The chip testing method of claim 6, wherein
the first vacuum line includes,
a field vacuum line formed on a surface of the chip tray,
a first inner vacuum line formed in the chip tray,
first vacuum holes connecting the field vacuum line with the first inner vacuum line, and
second vacuum holes formed to pass through an opposite surface of the chip tray from the first inner vacuum line, and
the second vacuum line includes,
a second inner vacuum line formed in the support chuck, and
third vacuum holes providing connection to the second inner vacuum line from a surface of the support chuck, and
the placing includes aligning the third vacuum holes with the second vacuum holes.

15. A chip testing method comprising:
cutting a multi-stack wafer into multi-stack chip packages, the multi-stack wafer including a plurality of chips vertically stacked thereon;
re-arranging the multi-stack chip packages on a chip tray to form a uniform distance between at least two adjacent multi-stack chip packages; and
testing each of the re-arranged multi-stack chip packages.

16. The chip testing method of claim 15, wherein a support chuck is coupled to the chip tray, the chip tray includes a first vacuum line and the support chuck includes a second vacuum line, the method further comprising:
   operating a vacuum pump connected to the second vacuum line to form a vacuum in the first vacuum line and the second vacuum line, and separating the chip tray from the support chuck to allow the first vacuum line to independently maintain the vacuum before testing each of the re-arranged multi-stack chip packages.

17. The chip testing method of claim 16, further comprising:
   transferring the chip tray to a chip testing apparatus before testing the re-arranged multi-stack chip packages.

18. The chip testing method of claim 17, further comprising:
   testing at least two chips of the multi-stack chip packages simultaneously using a plurality of probes of the chip testing apparatus.

* * * * *